(12) United States Patent
Harman

(10) Patent No.: US 8,896,347 B2
(45) Date of Patent: Nov. 25, 2014

(54) SYNCHRONOUS INPUT SIGNAL CAPTURE SYSTEM

(71) Applicant: Hamilton Sundstrand Corporation, Windsor Locks, CT (US)

(72) Inventor: David S. Harman, Simsbury, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 53 days.

(21) Appl. No.: 13/853,424

(22) Filed: Mar. 29, 2013

(65) Prior Publication Data

US 2014/0292370 A1    Oct. 2, 2014

(51) Int. Cl.
*H03K 19/00*      (2006.01)
*H03K 19/003*     (2006.01)

(52) U.S. Cl.
CPC ................... *H03K 19/003* (2013.01)
USPC ................. 326/93; 326/26; 326/46

(58) Field of Classification Search
CPC ........ H03K 5/135; H03K 5/1252; G06F 1/04; G06F 1/10
USPC .......................... 326/21, 26, 93–98
See application file for complete search history.

(56) References Cited

U.S. PATENT DOCUMENTS

| | | | |
|---|---|---|---|
| H1796 H | 7/1999 | Srivatsa et al. | |
| 6,275,546 B1* | 8/2001 | Miller et al. | 375/354 |
| 6,429,698 B1* | 8/2002 | Young | 327/99 |
| 6,738,442 B1 | 5/2004 | Wilcox | |
| 7,471,120 B2* | 12/2008 | Lou | 327/99 |
| 2002/0075042 A1* | 6/2002 | Ohkawa | 327/99 |
| 2010/0001767 A1* | 1/2010 | Shikata | 327/99 |
| 2010/0169675 A1 | 7/2010 | Kajihara | |
| 2013/0073890 A1 | 3/2013 | Lin | |

OTHER PUBLICATIONS

Extended European Search Report for related EP Application No. 14161767.0-1810, dated Aug. 4, 2014, pp. 1-9.

* cited by examiner

*Primary Examiner* — Don Le
(74) *Attorney, Agent, or Firm* — Cantor Colburn LLP

(57) ABSTRACT

A synchronous digital signal capture system includes a first flip-flop and a synchronization module. The first flip-flop receives a logic control signal and a first clock signal having a first frequency. The first flip-flop is configured to output a synchronized data signal based on the logic control, and generate a synchronous reset signal that is a logic inverse of the synchronized data signal generated at the data output. The synchronization module receives a primary data signal and is configured to generate the logic control signal based on the primary input signal, a second clock signal, and the synchronous reset signal such that the first flip-flop generates the synchronized signal.

14 Claims, 4 Drawing Sheets

SYNCHRONOUS INPUT SIGNAL CAPTURE SYSTEM

BACKGROUND

The present inventive concept relates generally to digital circuit systems, and more specifically, to a synchronous digital system that prevents hold time violations.

Conventional digital circuit systems, as illustrated in FIG. 1, typically include one or more flip-flops that can be used to store state information. Primary data signals are produced according to a clock signal transition (Clock A of FIG. 2) of a system clock signal. The clock signal transition (Clock A) must be such that the receiving component can read, i.e., sample, the primary data signal by the next transition (Clock B) of the system clock signal. As illustrated in signal diagram resulting from a conventional digital circuit system shown in FIG. 2, a normal 'low' going data pulse is provided in response to a first clock transition (Clock A) and remains active during a full clock period, until the occurrence of the next clock transition (Clock B of FIG. 2) plus Hold Time. Digital components, however, may provide narrow output pulses that terminate before the completion of a full clock period in width. The premature termination of the pulsed data signal may result in a Hold Time Violation (refer to Data with Hold Time Violation shown in FIG. 2). The Hold Time Violation causes receiving components to miss these narrower pulses, which would normally be sampled during the next clock transition, thereby preventing the narrow pulses from being sampled.

SUMMARY

According to one embodiment of the present inventive concept, a synchronous digital signal capture system includes a first flip-flop and a synchronization module. The first flip-flop receives a logic control signal and a first clock signal having a first frequency. The first flip-flop is configured to output a synchronized data signal based on the logic control, and to generate a synchronous reset signal that is a logic inverse of the synchronized data signal generated at the data output. The synchronization module receives a primary data pulse signal and is configured to generate the logic control signal based on the primary input signal, the synchronous reset signal and a second clock signal such that the first flip-flop generates the synchronized signal.

In another embodiment, a method of synchronously capturing a digital pulse signal comprises receiving a logic control signal and a first clock signal having a first frequency, and outputting a synchronized data signal based on the logic control. The method includes generating a synchronous reset signal that is a logic inverse of the synchronized data signal generated at the data output, and receiving a primary data signal. The method further includes generating the logic control signal based on the primary input signal, the synchronous reset signal and a second clock signal such that the first flip-flop generates the synchronized signal.

Additional features are realized through the techniques of the present inventive concept. Other embodiments of the inventive concept are described in detail herein and are considered a part of the claimed inventive concept. For a better understanding of the inventive concept with the features, refer to the description and to the drawings.

BRIEF DESCRIPTION OF THE SEVERAL VIEWS OF THE DRAWINGS

The subject matter which is regarded as the inventive concept is particularly pointed out and distinctly claimed in the claims at the conclusion of the specification. The forgoing and other features of the inventive concept are apparent from the following detailed description taken in conjunction with the accompanying drawings in which:

DETAILED DESCRIPTION

Figure 1:
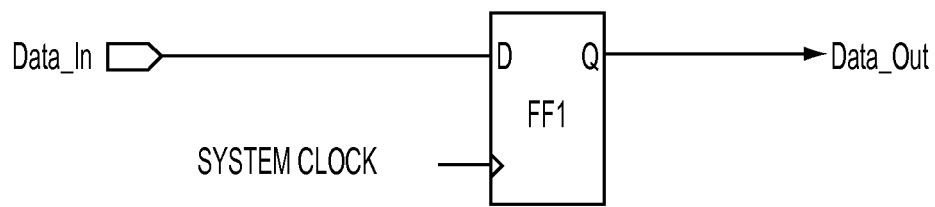
FIG. 1 illustrates a schematic of a conventional digital circuit system.
Figure 2:
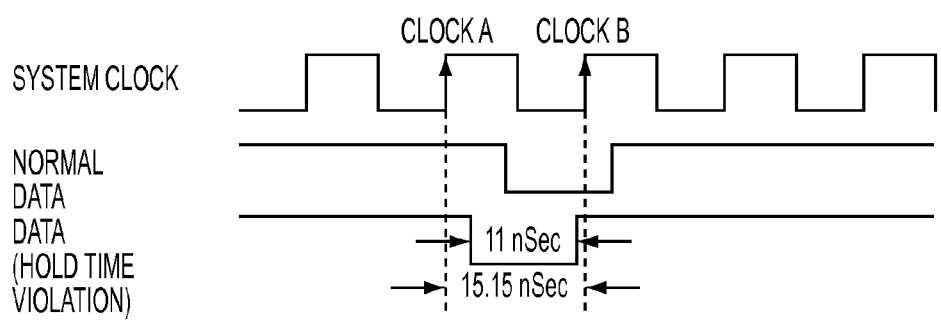
FIG. 2 is a signal diagram of the conventional digital circuit system illustrated in FIG. 1.
Figure 3:
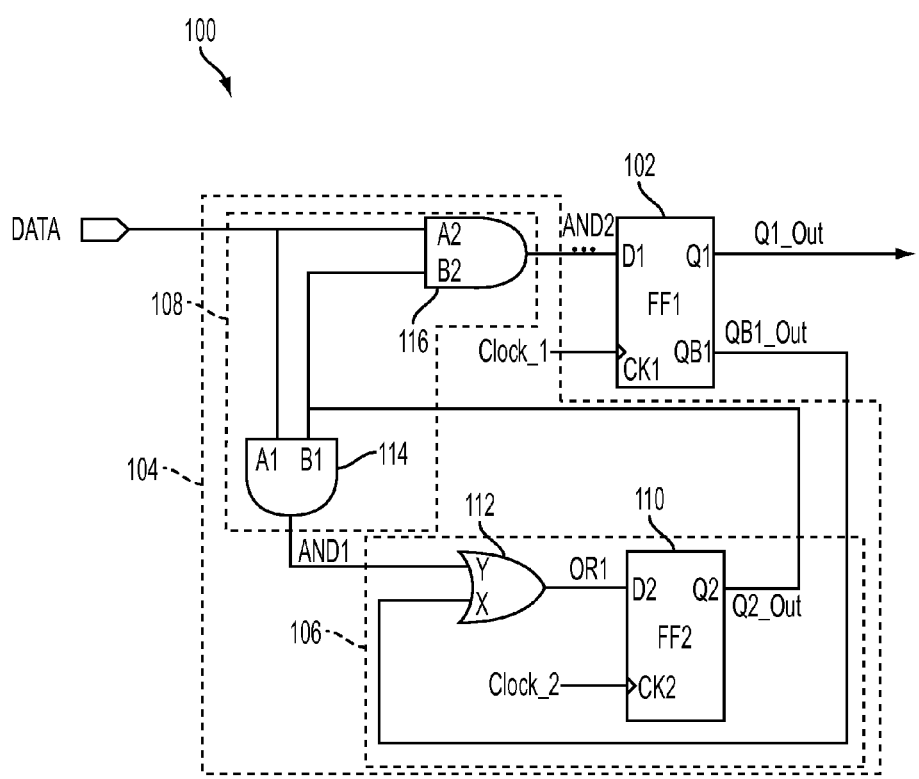
FIG. 3 is a schematic of a synchronous digital signal capture system according to an embodiment of present inventive concept.

Referring now to FIG. 3, a schematic of a synchronous digital signal capture system 100 is illustrated according to an embodiment of present inventive concept. The synchronous digital signal capture system 100 includes a first flip-flop 102 and a synchronization module 104. The first flip-flop 102 includes a control input (D), a clock input (CK) and a data output (Q1). The control input receives a logic control signal and the clock input receives a first clock signal, i.e., a system clock (Clock_1) having a first frequency. The data output provides a synchronized data signal (Q1_OUT) based on the logic control signal. More specifically, Q1_OUT is a logic 'low' in response to the logic control signal being a logic 'low', and Q1_OUT is a logic 'high' in response to the logic control signal being a logic 'high'. The first flip-flop 102 further includes an inverting output (QB) to output a synchronous reset signal (QB1_Out) that is a logic inverse of the synchronized data signal (Q1_OUT) generated at the data output to reset the system 100.

The synchronization module 104 is interposed between an input primary data signal (DATA) and the first flip-flop 102. The synchronization module 104 is configured to receive the primary data signal (DATA), the synchronous reset signal (QB1_Out) and the second clock signal (Clock_2). The second clock signal (Clock_2) is an accelerated clock signal that has a frequency greater than the frequency of the first clock signal (Clock_1). Based on DATA, QB1_Out and Clock_2, the synchronization module 104 generates the logic control signal such that the first flip-flop 102 generates the synchronized signal (Q1_OUT), which may be utilized by various internal logic located downstream from the system 100. In at least one embodiment, the primary data signal (DATA) is an active-low pulse having a predetermined pulse-width.

The synchronization module 104 includes a latching feedback circuit 106 and a control circuit 108. The latching feedback circuit 106 includes a second flip-flop 110, and an OR gate 112. The second flip-flop 110 has a latch feedback input (D2), an accelerated clock input (CK2), and latch feedback output (Q2). The second flip-flop 110 outputs a latch feedback signal (Q2_OUT) at Q2 based on a latching flip-flop control signal (OR1) received at D2 and the accelerated clock signal (Clock_2) input at CK2. As mentioned above, the accelerated clock signal (Clock_2) is a clock signal having frequency that is greater than Clock_1 input to the first flip-flop 102. In at least one example according the present inventive concept, the accelerated clock signal has frequency that is four times (4×) the frequency of CK input to the first flip-flop. The latch feedback signal (Q2_OUT) latches synchronization module 104 as discussed in greater detail below.

The OR gate 112 includes a first input (X) and a second input (Y). The first input X is in electrical communication with QB1 of the first flip-flop 102 to receive the synchronous reset signal (QB1_OUT). The second OR input Y is configured to receive a feedback control signal (AND1), which is generated by the control circuit 108 as discussed in greater detail below. Based on AND1 and the QB1_OUT, the OR gate 112 generates a control signal (OR1) that exists in either a first state (OR1=0), which operates as a latch control signal, or a second state (OR1=1) which operates as a latch reset signal. The latch control signal commands the second flip-flop 110 to generate the latch feedback control signal (Q2_OUT=0), while the latch reset control signal resets the second flip-flop 110 (Q2_OUT=1).

The control circuit 108 includes a first AND gate 114 to control the latching feedback circuit 106 and a second AND gate 116 to control the first flip-flop 102. The first AND gate 114 includes a first data input (A1) to receive the primary data signal (DATA), and a first latch input (B1) in electrical communication with Q2 to receive the delayed feedback signal (Q2_OUT). The first AND gate 114 further includes a first control output (AND1) in electrical communication with the second input Y of the OR gate 112. Accordingly, the first AND gate 114 is configured to generate the feedback control signal (AND1) that controls the output of the OR gate 112 (OR1) based on the primary data signal (DATA) and latch feedback signal (Q2_OUT).

The second AND gate 116 includes a second data input (A2) and a second latch feedback input (B2). The second data input (A2) is in electrical communication with A1 to receive the primary data signal (DATA). The latch feedback input (B2) is in electrical communication with B1 to receive the latch feedback signal (Q2_OUT). The second AND gate 116 further includes a second control output (AND2) in electrical communication with the control input (D1) of the first flip-flop 102 to provide the logic control signal thereto based on the primary data signal (DATA) and the latch feedback signal (Q2_OUT). The logic state of the first flip-flop output (Q1) follows the state of the control input (D1) subsequent to each rising transition of the system clock (Clock_1) at CK1. Although the embodiment illustrated in FIG. 3 includes first and second AND gates 114, 116, it is appreciated by one of ordinary skill in the art that the first and second AND gates 114, 116 may be replaced with a single AND gate having an output connected to D1 of the first flip-flop 114 and the Y input of the OR gate 112, without changing the scope of the present inventive concept.

Figure 4:
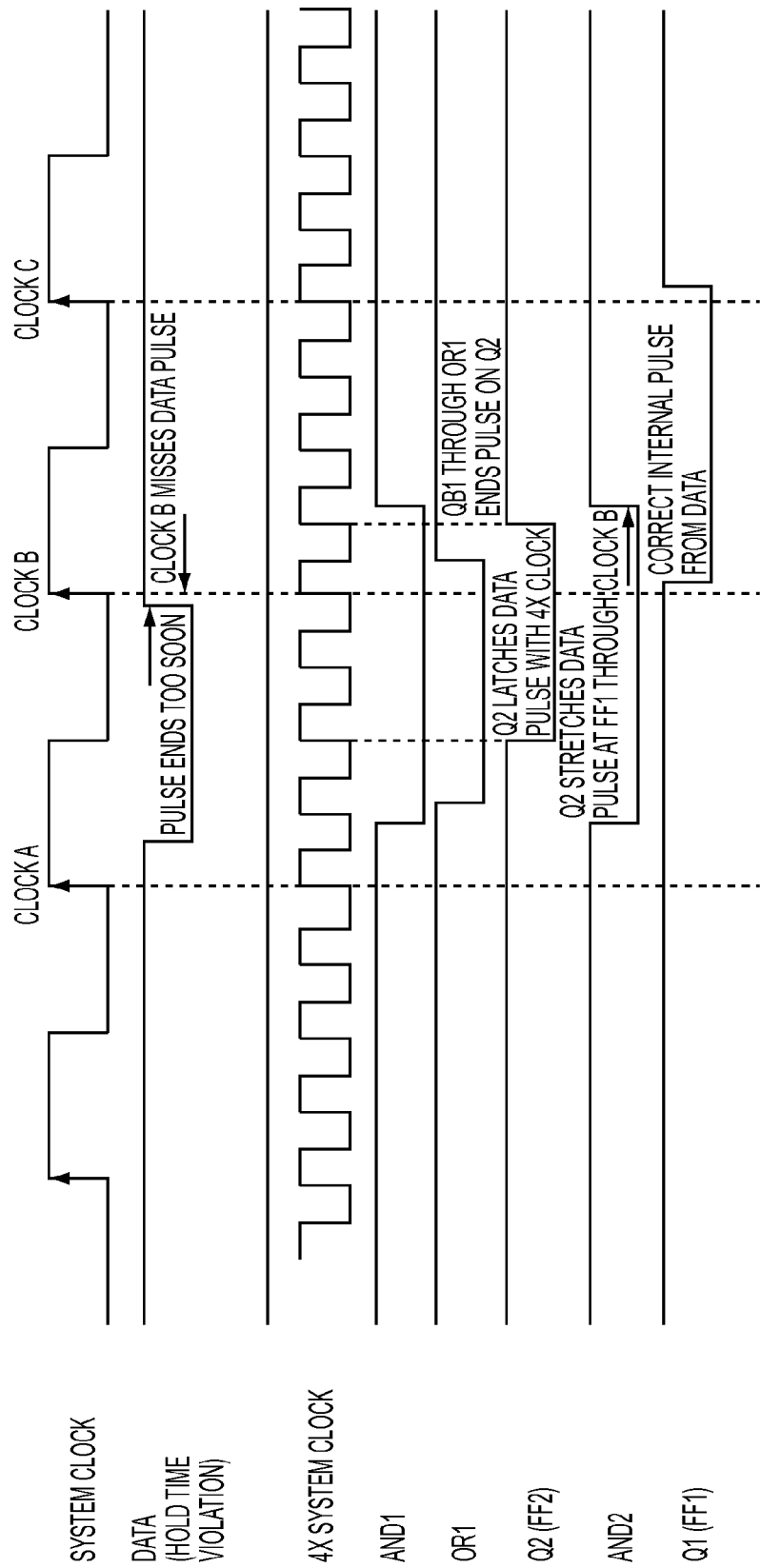
FIG. 4 is a signal diagram of the synchronous digital signal capture system illustrated in FIG. 3 according to an embodiment of the present inventive concept.

With reference now to the signal diagram illustrated in FIG. 4, operation of the synchronous digital signal capture system 100 will be described according to an embodiment of the present inventive concept. More specifically, at least one embodiment of the 100 may prevent hold time violations in active-low primary data signals, where a single active-low pulse which may be too narrow for to be sampled by the first flip-flop 102 by the next clock transition. That is, the single active-low pulse terminates before being sampled by the next clock transition of the primary clock signal (CK1). At normal steady state with DATA at logic 'high', signals Q1, AND1, AND2, OR1 and Q2 are also 'high'. When DATA transitions 'low', signals AND1, AND2 then OR1 transition 'low'. Within a quarter clock cycle, the latch feedback signal (Q2_OUT) output from the second flip-flop 110 transitions 'low' forcing and holding AND1 and AND2 'low', i.e., latching the first and second AND gate 114, 116.

The first AND gate 114 and the OR gate 112 provide the latch feedback signal to hold the second flip-flop 110 'low' until the first flip-flop 102 is clocked. When the first flip-flop 102 realizes the control signal from the second AND gate 116 is logic 'low', the first flip-flop 102 synchronously outputs Q1_OUT at logic 'low', which may be utilized by downstream internal logic. Further, when Q1_OUT is logic 'low', the reset signal (QB1) transitions to logic 'high', thereby forcing the latching flip-flop control signal (OR1) to a logic 'high' which sets the second flip-flop 110 (Q2) 'high' after its next 4x clock-cycle to reset the system 100. With Q2 'high', the first and second AND gate 114, 116 will follow the value of the primary data signal, which will imminently be set to logic 'high'. Accordingly, a logic 'high' at the input of the second AND gate 116 will generate a logic 'high' output from the first flip-flop 102, thereby ending the pulse after one system clock, i.e., the period between CLOCK A and CLOCK B, CLOCK B and CLOCK C, etc.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present inventive concept has been presented for purposes of illustration and description, but is not intended to be exhaustive or limited to the inventive concept in the form disclosed. Many modifications and variations will be apparent to those of ordinary skill in the art without departing from the scope and spirit of the inventive concept. The embodiments presented are disclosed in order to best explain the principles of the inventive concept and the practical application, and to enable others of ordinary skill in the art to understand the inventive concept for various embodiments with various modifications as are suited to the particular use contemplated.

The flow diagrams depicted herein are just one example. There may be many variations to this diagram or the steps (or operations) described therein without departing from the spirit of the inventive concept. For instance, the steps may be performed in a differing order or steps may be added, deleted or modified. All of these variations are considered a part of the claimed inventive concept.

While various embodiments of the inventive concept had been described, it will be understood that those skilled in the art, both now and in the future, may make various modifications to the embodiments which fall within the scope of the claims which follow. These claims should be construed to maintain the proper protection for the invention first described.

What is claimed is:

1. A synchronous digital signal capture system, comprising:
   a first flip-flop to receive a logic control signal and a first clock signal having a first frequency, the first flip-flop configured to output a synchronized data signal based on the logic control signal, and to generate a synchronous reset signal that is a logic inverse of the synchronized data signal;
   a synchronization module including an input to receive a primary data signal and an output in electrical communication with the first flip-flop, the synchronization module configured to generate the logic control signal based on the primary data signal, the synchronous reset signal and a second clock signal such that the first flip-flop generates the synchronized data signal.

2. The synchronous digital signal capture system of claim 1, wherein the synchronized data signal is a logic low in response to the logic control signal being a logic low and the synchronized data signal is a logic high in response to the logic control signal being a logic high.

3. The synchronous digital signal capture system of claim 2, wherein the synchronization module comprises:
- a latching feedback circuit to generate a latch feedback signal; and
- a control circuit in electrical communication with the first flip-flop and the latching feedback circuit, the control circuit configured to generate at least one control signal based on the primary data signal and the latching feedback signal.

4. The synchronous digital signal capture system of claim 3, wherein the latching feedback circuit comprises:
- a second flip-flop configured to generate the latch feedback signal based on a latching flip-flop control signal and the second clock signal.

5. The synchronous digital signal capture system of claim 4, wherein the second clock signal has a frequency that is greater than the frequency of the first clock signal.

6. The synchronous digital signal capture system of claim 5, wherein the latching feedback circuit further comprises:
- an OR gate to receive the synchronous reset signal, the OR gate configure to receive a feedback control signal and to generate the latching flip-flop control signal based on the feedback control signal and the synchronous reset signal.

7. The synchronous digital signal capture system of claim 6, wherein the control circuit comprises:
- a first AND gate in electrical communication with the second flip-flop to receive the latch feedback signal, the first AND gate configured to receive the primary data signal and to generate the feedback control signal based on the primary data signal and the latch feedback signal.

8. The synchronous digital capture system of claim 7, wherein the control circuit further comprises:
- a second AND gate in electrical communication with the first AND gate to receive the primary data signal and to receive the latch feedback signal, the second AND gate outputting the logic control signal to the first flip-flop based on the primary data signal and the latch feedback signal such that first flip-flop generates a logic high after one signal pulse in response to the second AND gate outputting a logic high.

9. A method of synchronously capturing a digital signal, the method comprising:
- receiving a logic control signal and a first clock signal having a first frequency;
- outputting a synchronized data signal based on the logic control signal;
- generating a synchronous reset signal that is a logic inverse of the synchronized data signal;
- receiving a primary data signal; and
- generating the logic control signal based on the primary data signal, the synchronous reset signal and a second clock signal, and generating the synchronized data signal in response to generating the logic control signal.

10. The method of claim 9, wherein synchronized data signal is a logic low in response to the logic control signal being a logic low and the synchronized data signal is a logic high in response to the logic control signal being a logic high.

11. The method of claim 10, further comprising generating a latching feedback signal, generating a latch feedback signal based on a latching control signal and the second clock signal.

12. The method of claim 11, further comprising generating the second clock signal having a frequency greater than the frequency of the first clock signal.

13. The method of claim 12, further comprising generating a feedback control signal, and generating the latching flip-flop control signal based on the feedback control signal and the synchronous reset signal, wherein the feedback control signal is generated in response to the primary data signal and the latch feedback signal.

14. The method of claim 13, further comprising outputting the logic control signal based on the primary data signal and the latch feedback signal such that first flip-flop generates a logic high after one signal pulse in response to the second AND gate outputting a logic high.

* * * * *